(12) United States Patent
Lee

(10) Patent No.: US 9,706,639 B2
(45) Date of Patent: Jul. 11, 2017

(54) CIRCUIT BOARD AND METHOD OF MANUFACTURING THE SAME

(71) Applicant: Samsung Electro-Mechanics Co., Ltd., Suwon-si (KR)

(72) Inventor: Jae-Seok Lee, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/070,294

(22) Filed: Mar. 15, 2016

(65) Prior Publication Data
US 2016/0374189 A1   Dec. 22, 2016

(30) Foreign Application Priority Data

Jun. 18, 2015  (KR) .................. 10-2015-0086716
Jan. 21, 2016  (KR) .................. 10-2016-0007722

(51) Int. Cl.
| | |
|---|---|
| H05K 1/00 | (2006.01) |
| H05K 1/02 | (2006.01) |
| H05K 1/18 | (2006.01) |
| H05K 3/42 | (2006.01) |
| H05K 3/46 | (2006.01) |

(52) U.S. Cl.
CPC .......... *H05K 1/0209* (2013.01); *H05K 1/185* (2013.01); *H05K 3/429* (2013.01); *H05K 3/4602* (2013.01); *H05K 3/4697* (2013.01); H05K 2201/09063 (2013.01); H05K 2201/09536 (2013.01)

(58) Field of Classification Search
CPC .. H05K 1/02; H05K 1/03; H05K 1/09; H05K 1/11; H05K 1/18; H05K 3/00; H05K 3/10; H05K 3/30; H05K 3/40; H05K 3/46; H05H 7/20; H01L 21/02; H01L 21/44; H01L 21/48; H01L 21/50; H01L 23/34; H01L 23/52
USPC ........ 174/252, 251, 255–258, 260–262, 264, 174/266, 535; 361/705, 707, 720, 748, 361/761; 438/111, 106, 125; 257/535, 257/698, 706
See application file for complete search history.

(56) References Cited

U.S. PATENT DOCUMENTS

| | | | | |
|---|---|---|---|---|
| 4,604,678 A | * | 8/1986 | Hagner | ................. H01L 23/538 174/257 |
| 4,894,271 A | * | 1/1990 | Hani | ...................... B32B 15/14 156/89.15 |
| 5,180,440 A | * | 1/1993 | Siegel | .................... G09B 19/24 136/200 |

(Continued)

*Primary Examiner* — Xiaoliang Chen
(74) *Attorney, Agent, or Firm* — NSIP Law

(57) ABSTRACT

Disclosed are a circuit board and a method of manufacturing the same. The circuit board includes a core layer comprising a first surface and a second surface opposing the first surface, at least one first build-up layer formed on the first surface, and comprising a first conductive pattern and a first conductive via, at least one second build-up layer formed on the second surface, and comprising a second conductive pattern and a second conductive via, a cavity formed to pass through the core layer, the first build-up layer and the second build-up layer, and a heat dissipation unit disposed inside the cavity, and an outer layer formed on a surface of the first build-up layer and a surface of the second build-up layer and the outer layer being configured to be connected to the heat dissipation unit.

15 Claims, 13 Drawing Sheets

(56) References Cited

U.S. PATENT DOCUMENTS

| | | | | | |
|---|---|---|---|---|---|
| 5,371,653 A * | 12/1994 | Kametani | ............. | H01L 23/467 | 174/252 |
| 5,625,227 A * | 4/1997 | Estes | ................... | H01L 23/3675 | 257/712 |
| 5,804,422 A * | 9/1998 | Shimizu | ............. | H01L 21/4857 | 438/111 |
| 5,817,404 A * | 10/1998 | Kawakita | ............ | H01L 21/4857 | 257/E23.105 |
| 6,205,028 B1 * | 3/2001 | Matsumura | .......... | H05K 1/0201 | 174/252 |
| 6,262,579 B1 * | 7/2001 | Chazan | ............... | H01L 21/4857 | 257/E23.172 |
| 6,392,600 B1 * | 5/2002 | Carson | ................... | H01Q 1/246 | 343/700 MS |
| 6,611,055 B1 * | 8/2003 | Hashemi | ............. | H01L 23/3677 | 257/706 |
| 6,960,824 B1 * | 11/2005 | Hashemi | ............. | H01L 23/3677 | 257/698 |
| 7,247,516 B1 * | 7/2007 | Hashemi | ............. | H01L 21/4846 | 257/E21.499 |
| 2002/0045394 A1 * | 4/2002 | Noda | ........................ | B32B 3/10 | 442/180 |
| 2002/0167084 A1 * | 11/2002 | Coccioli | ............. | H01L 23/3677 | 257/732 |
| 2003/0002260 A1 * | 1/2003 | Hasebe | ................. | H01L 23/142 | 361/720 |
| 2004/0051172 A1 * | 3/2004 | Miyazaki | ................ | H01L 23/13 | 257/706 |
| 2005/0178574 A1 * | 8/2005 | Noguchi | ............. | H01L 23/3677 | 174/535 |
| 2006/0209517 A1 * | 9/2006 | Yui | ..................... | H01L 23/3677 | 361/719 |
| 2006/0222285 A1 * | 10/2006 | Minamio | .......... | H01L 27/14618 | 385/14 |
| 2006/0273816 A1 * | 12/2006 | Hsu | ...................... | G01R 1/0483 | 174/255 |
| 2007/0044999 A1 * | 3/2007 | Shibata | ................. | H05K 3/445 | 174/262 |
| 2007/0079276 A1 * | 4/2007 | Ashida | ................ | G06F 17/5081 | 174/262 |
| 2009/0207630 A1 * | 8/2009 | Satoh | ................... | G02B 6/0085 | 362/615 |
| 2009/0283299 A1 * | 11/2009 | Suzuki | ................ | H05K 1/0207 | 174/251 |
| 2010/0110692 A1 * | 5/2010 | Yu | ......................... | H01L 33/483 | 362/294 |
| 2011/0114372 A1 * | 5/2011 | Kato | ...................... | H05K 1/115 | 174/256 |
| 2011/0290408 A1 * | 12/2011 | Samejima | ............. | H05K 3/445 | 156/182 |
| 2012/0024586 A1 * | 2/2012 | Yoshimura | ............. | H05K 1/036 | 174/264 |
| 2012/0229990 A1 * | 9/2012 | Adachi | ................ | H05K 3/4608 | 361/748 |
| 2012/0246924 A1 * | 10/2012 | Hibino | ............. | H01L 23/49827 | 29/829 |
| 2012/0247818 A1 * | 10/2012 | Adachi | ................... | H05K 3/445 | 174/257 |
| 2013/0027896 A1 * | 1/2013 | Lee | ........................ | H05K 1/185 | 361/761 |
| 2014/0043783 A1 * | 2/2014 | Ohira | ................... | H05K 1/0207 | 361/767 |
| 2014/0268589 A1 * | 9/2014 | Nakamura | ........... | H05K 1/0206 | 361/748 |
| 2014/0311772 A1 * | 10/2014 | Mizutani | ................ | H05K 3/429 | 174/251 |
| 2014/0353027 A1 * | 12/2014 | Osaki | ..................... | H05K 1/115 | 174/264 |
| 2015/0034378 A1 * | 2/2015 | Kajihara | ................ | H05K 3/427 | 174/266 |
| 2015/0107880 A1 * | 4/2015 | Kim | ....................... | H05K 1/185 | 174/255 |
| 2015/0189751 A1 * | 7/2015 | Akahoshi | ............. | H05K 3/4661 | 174/262 |
| 2015/0319842 A1 * | 11/2015 | Asano | ................... | H05K 3/0026 | 361/707 |
| 2015/0327397 A1 * | 11/2015 | Murayama | .......... | H01L 23/3675 | 361/719 |
| 2016/0150642 A1 * | 5/2016 | Kajita | ................... | H05K 1/115 | 361/783 |

* cited by examiner

CIRCUIT BOARD AND METHOD OF MANUFACTURING THE SAME

CROSS REFERENCE TO RELATED APPLICATION(S)

This application claims the benefit under 35 USC §119(a) of Korean Patent Application No. 10-2015-0086716 filed on Jun. 18, 2015 and Korean Patent Application No. 10-2016-0007722 filed on Jan. 21, 2016 in the Korean Intellectual Property Office, the entire disclosure of which are incorporated herein by reference for all purposes.

BACKGROUND

1. Field

The following description relates to a circuit board.

2. Description of Related Art

A circuit board can be used for various types of electro component package applications such as a system in package (SiP) enclosing a number of chips or a module package. High thermal dissipation is needed for circuit boards for electro component package applications to effectively release heat generated from electro components. These thermal dissipation properties are highly related to reliability operations and quality of electro component packages.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a circuit board includes a core layer including a first surface and a second surface opposing the first surface, at least one first build-up layer formed on the first surface, and comprising a first conductive pattern and a first conductive via, at least one second build-up layer formed on the second surface, and comprising a second conductive pattern and a second conductive via, a cavity formed to pass through the core layer, the first build-up layer and the second build-up layer, and a heat dissipation unit disposed inside the cavity, and an outer layer formed on a surface of the first build-up layer and a surface of the second build-up layer and the outer layer being configured to be connected to the heat dissipation unit.

The outer layer may fill a space between the heat dissipation unit and an inner wall of the cavity.

A thickness of the heat dissipation unit may be greater than that of the core layer.

The thickness of the heat dissipation unit may be at least 80% of a depth of the cavity.

A first portion of a surface of the heat dissipation unit near an edge of at least one of the upper surface or the lower surface may be covered by the outer layer and a second portion of the surface of the heat dissipation unit may be exposed.

At least one of the upper surface and the lower surface of the heat dissipation unit may be covered by the outer layer.

At least one of the outer layer may include opening parts to expose a portion of the upper surface or the lower surface of the heat dissipation unit.

At least one of the first build-up layer and the second build-up layer may include a plurality of build-up layers, and the cavity passes through the plurality of build-up layers.

At least one of the first build-up layer and the second build-up layer may include a plurality of build-up layers, and the cavity does not pass through an outermost build-up layers.

A heat dissipation via may be formed in the outermost built-up layer, and the heat dissipation via may be directly connected to the heat dissipation unit.

The outer layer may include a solder resist.

The circuit board may include a chip mounting area, and the cavity may have a smaller area than the surface area of chip mounting area, and the cavity may be arranged inside the chip mounting area.

The circuit board may include a heat dissipation metal layer formed on at least one of the upper surface or the lower surface of the heat dissipation unit, and a cross-sectional area of the heat dissipation metal layer may be greater than a cross-sectional area of the heat dissipation unit.

The heat dissipation unit may be spaced apart from an inner wall of the cavity, and the heat dissipation metal layer may cover the space formed between the inner wall of the cavity and the heat dissipation unit.

A side surface of the heat dissipation metal layer may be connected with the conductive pattern.

The outer layer may have opening parts to expose at least a portion of the outermost surface of the heat dissipation metal layer.

According to another general aspect, a circuit board includes a build-up laminate comprising build-up layers, each layer of the build-up layers comprising a conductive pattern and a conductive via, a cavity formed to pass through the build-up layers, a heat dissipation unit disposed inside the cavity, and an outer layer formed on the surface of the build-up laminate and the outer layer being disposed on at least a portion of the heat dissipation unit.

According to still another general aspect, a method for manufacturing a circuit board includes preparing a core layer comprising a first surface and a second surface opposing the first surface, preparing a board laminate by forming at least one first build-up layer on the first surface and at least one second build-up layer formed the second surface, forming a conductive pattern and a conductive via on each of the first build-up layer and the second build-up layer, forming a cavity to pass through the board laminate, arranging a heat dissipation unit inside the cavity, and forming an outer layer on a surface of the first build-up layer and a surface of the second build-up layer to be connected to the heat dissipation unit.

A width of the heat dissipation unit may be smaller than a width of the cavity, and the arranging of the heat dissipation unit may include arranging the board laminate on a supporting film and arranging the heat dissipation unit inside the cavity at a distance from an inner wall of the cavity.

The forming of the outer layer may include forming a first outer layer on one surface of the first build-up layer to fill the space between the inner wall of the cavity and the heat dissipation unit, and forming a second outer layer on the surface of the second build-up layer after eliminating the supporting film.

The method may include eliminating a portion of the outer layer to expose a part of the conductive pattern formed on the each surface of the first build-up layer, the second build-up layer, and a part of the heat dissipation unit.

The circuit board according to an example increases volume of the heat dissipation unit or provides the heat dissipation unit closer to an electro component or a heat releasing region to improve the thermal dissipation property of the circuit board.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the description of the present disclosure, terms such as "upper part", "upper surface", "lower part" and "lower surface" are represented based on the direction of attached figures so that they may be actually different depending on the direction to which a device is arranged.

Circuit boards according to some examples may be applied into various electronic devices, such as, for example, a mobile phone, a personal digital assistant, a digital video camera, a digital still camera, a network system, a computer, a monitor, a television, a video game, a smart watch, and various electronic devices well known to one of ordinary skill in the art.

Figure 1:
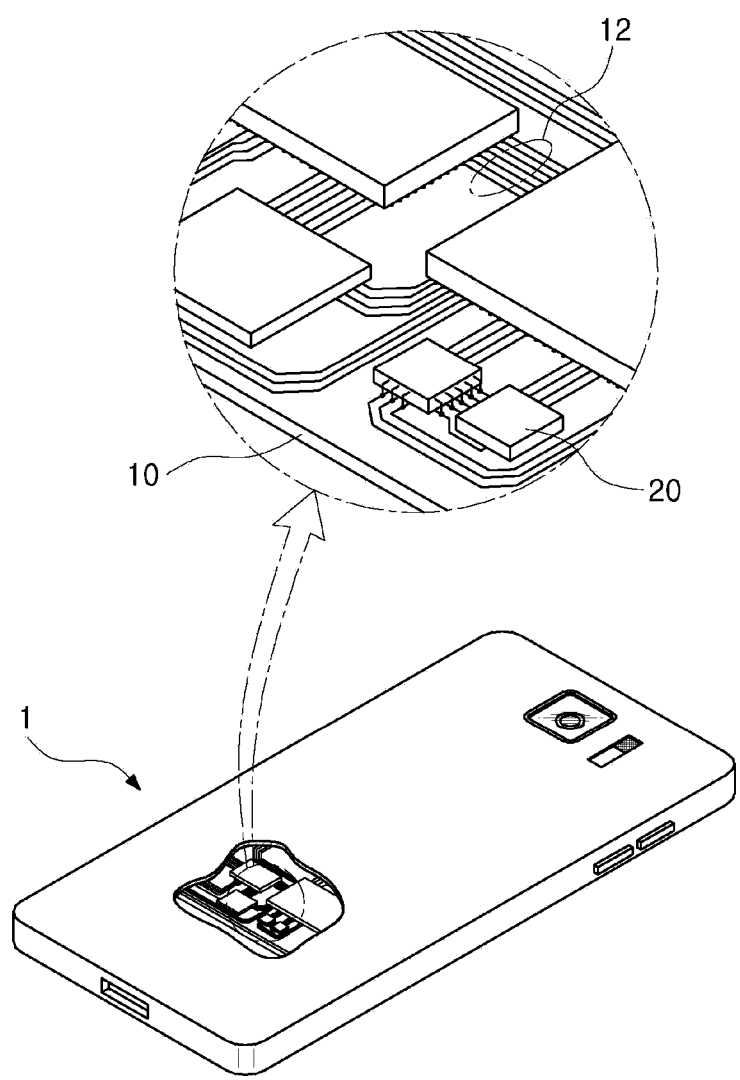
FIG. 1 is a diagram illustrating an example of an electronic device which is applied to an example of a circuit board.

FIG. 1 is diagram illustrating an example of an electronic device, which is applied to an example of a circuit board.

Referring to FIG. 1, a circuit board according to an example may be used as a main circuit board 10 to install or embed various electronic components 20 in an electronic device 1. The circuit board may be also used as a base board (not shown) of the electronic components 20 such as a semiconductor package which has a smaller size. Furthermore, it may be applied in various forms to other electronic devices in addition to mobile devices.

Figure 2A:
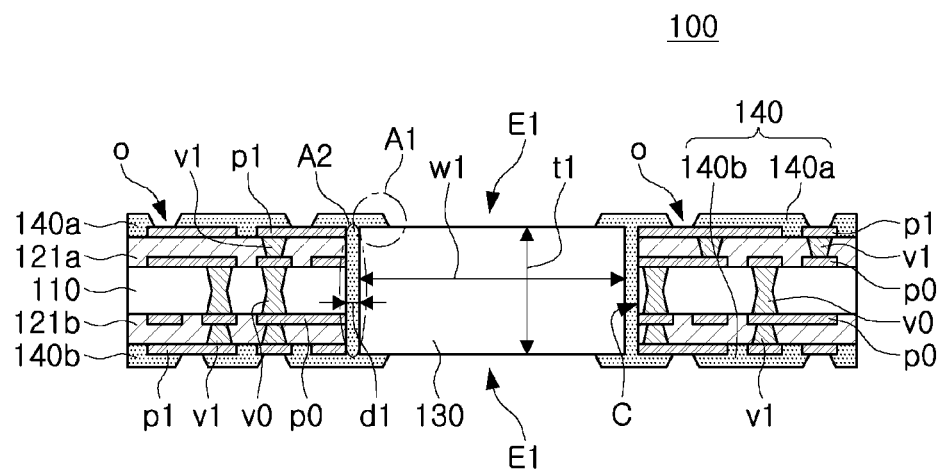
FIG. 2A and FIG. 2B are diagrams illustrating examples of a circuit board.

FIG. 2A is a diagram illustrating an example of a circuit board.

Referring to FIG. 2A, a circuit board 100 according to an example may include a core layer 110, and a first build-up layer 121a and a second build-up layer 121b formed on the upper surface and the lower surface of the core layer 110, respectively. In this description, a structure including the core layer 110, and the first build-up layer 112a and the second build-up layer 112b in the circuit board 100 may be called as a "board laminate."

The core layer 110 may include an inner layer circuit including a conductive pattern p0 formed on the upper surface and the lower surface and a conductive via v0 passing through the upper surface and the lower surface. The core layer 110 may be formed of a material having high rigidity to prevent warpage of the circuit board 100. For example, the core layer 110 may be an insulating resin containing a reinforcing agent such as, for example, prepreg, glass, or a metal (e.g., Invar). The reinforcing agent may be a glass fiber or a metallic material and the insulating resin may be a bismaleimide triazine resin or an epoxy resin. When the core layer 110 is a conductive material such as a metal, the surface of the inner layer circuit may be coated with an insulating material.

The first build-up layer 121a and the second build-up layer 121b may include an outer layer circuit including a conductive pattern p1 and a conductive via v1. The first build-up layer and the second build-up layer 121a, 121b may be formed of an insulating material to electrically insulate between circuits. For example, the insulating material may be a thermosetting resin such as an epoxy resin or a thermoplastic resin such as polyimide. The first build-up layer and the second build-up layer 121a and 121b may be also a photocurable insulating resin such as a photosensitivity insulating film. The conductive patterns p0 and p1 and/or the conductive vias v0, v1 may be composed of material such as, for example, Cu, Al, Ag, Sn, Au, Ni, Pd, or an alloy thereof. In another example, the conductive patterns p0 and p1 may be also formed from a copper foil.

A cavity C may pass through the board laminate and a heat dissipation unit 130 may be formed therein. The heat dissipation unit 130 may be formed of a material having good thermal conductivity, such as, for example, Cu, Al or Invar. The heat dissipation unit 130 is illustrated in a cuboid block in FIG. 2 but may be formed in various shapes without departing from the spirit and scope of the illustrative examples described.

In this example, since the cavity C is formed to pass through the core layer 110 and the first build-up layer and the second build-up layer 121a, 121b, a thickness t1 of the heat dissipation unit 130 may be at least greater than that of the core layer 110. As shown in FIG. 2A, the thickness t1 of the heat dissipation unit 130 may be corresponded to a depth of the cavity C so that the heat dissipation unit 130 has enough volume to improve the thermal dissipation. The heat dissipation unit 130 may be positioned to efficiently release heat. For example, the upper surface of the heat dissipation unit 130 may be placed adjacent to the area where an electro component (not shown), which causes heat, is installed. In an example, the upper surface of the heat dissipation unit 130 may be in contact with the electronic component directly or through another unit, such as, for example, a solder bump (see FIG. 6). On the other hand, the lower surface of the heat dissipation unit 130 may be placed to be adjacent to the level of the lower surface of the second build-up layer 121b to easily release heat to the outside.

The cavity C may increase the thermal dissipation by expanding the heat dissipation unit 130 toward the laminating direction. In an example, the thickness t1 of the heat dissipation unit 130 may be 80% or higher than of that of the board laminate (e.g., core layer 110 and the first build-up layer and the second build-up layer 121a, 121b).

The circuit board 100 may include an outer layer 140. The outer layer 140 may include a first outer layer 140a and a second outer layer 140b formed on the first build-up layer 121a and the second build-up layer 121b, respectively. The outer layer 140 may be a solder resist layer. The outer layer 140 may include a plurality of openings to expose the conductive patterns p1, which is formed on the outmost layer to an external circuit or an electronic component (not shown). In an example, the external circuit or an electronic component (not shown) may be connected to the conductive patterns p1 of the circuit board 100 through these openings.

The outer layer 140 may be formed to be connected with the heat dissipation unit 130. The heat dissipation unit 130 may be supported inside the cavity C by the areas A1 and A2 to which the outer layer 140 is connected. In this example, the heat dissipation unit 130 may be supported by the area A1 extended to a part of the edge of the upper surface and the lower surface of the heat dissipation unit 130 among the outer layer 140. A main area E1 of the upper surface and the lower surface of the heat dissipation unit 130 may be exposed. In addition, a width w1 of the heat dissipation unit 130 may be designed to be less than that of the cavity C so that the heat dissipation unit 130 may be arranged to have a constant distance d1 from the inner wall of the cavity C. Thus, the heat dissipation unit 130 may be firmly supported by the area A2 which is filled between the inner wall of the cavity C and the heat dissipation unit 130 among the outer layer 140.

Figure 2B:
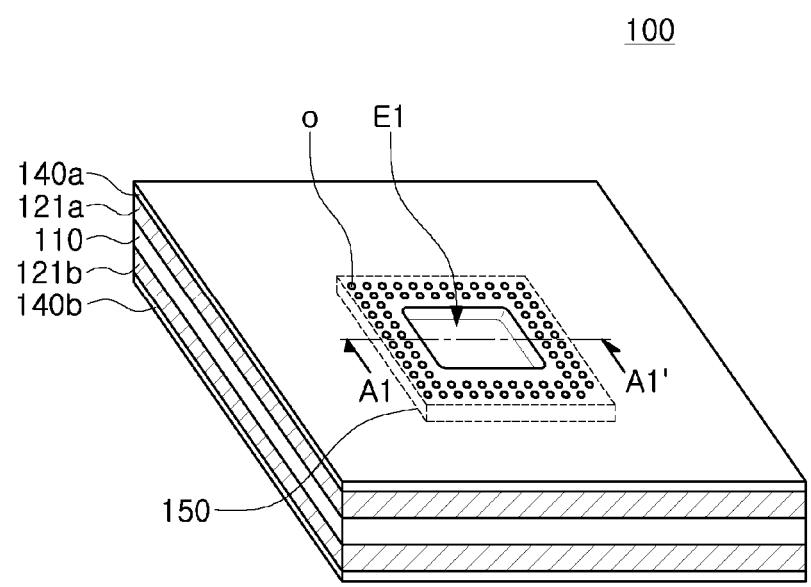

FIG. 2A is a diagram illustrating a a section along A1-A1' of the circuit board of FIG. 2B.

As shown in FIG. 2B, an electro component 150, indicated by a broken line on the upper surface of the circuit board 100 according to an example, may be formed to be electrically connected with the outer layer circuit through a plurality of opening parts "o." The electronic component 150 may be directly in contact with or adjacent to the exposed area E1 of the heat dissipation unit 130 to efficiently release heat through the heat dissipation unit 130.

FIG. 3A to FIG. 3G are diagrams illustrating step of an example of a method for manufacturing the circuit board of FIG. 2A. The operations in FIGS. 3A to 3G may be performed in the sequence and manner as shown, although the order of some operations may be changed or some of the operations omitted without departing from the spirit and scope of the illustrative examples described. Many of the operations shown in FIGS. 3A to 3G may be performed in parallel or concurrently. The above descriptions of FIGS. 1-2B, is also applicable to FIGS. FIGS. 3A to 3G, and is incorporated herein by reference. Thus, the above description may not be repeated here Referring to FIG. 3A, a core layer 110 has a first surface 110A and a second surface 110B. In this step, s conductive via v0 is formed to pass through the first surface and the second surface 110A and 110B and further a conductive pattern p0 is formed thereon to provide a desired inner layer circuit. The conductive via v0 may electrically connect the conductive patterns p0 formed on the surface 110A and 110B with each other.

The conductive via v0 may be formed by forming a through hole at a desired position of the core layer 110 and performing a plating process. The through hole may be formed using a mechanical drill and/or a laser drill. In an example, the laser drill may be a $CO_2$ laser or a YAG laser. However, the laser drill is not limited thereto and other drills may be used departing from the spirit and scope of the illustrative examples described.

The conductive pattern p0 of the core layer 110 may be formed through various processes. In an example, the conductive pattern p0 may be formed by providing a copper foil on the first surface and the second surface 110A and 110B and then selectively removing the copper foil using an etching resist pattern. The conductive pattern p0 may be also formed by a deposition process using a dry film pattern, such as, for example, a chemical vapor deposition (CVD), a physical vapor deposition (PVD) such as sputtering, a subtractive process, an additive process using electroless copper plating or copper electroplating, a semi-additive process (SAP) and a modified semi-additive process (MSAP). However, the deposition process may not be limited thereto and other deposition process may be used departing from the spirit and scope of the illustrative examples described.

Figure 3A:
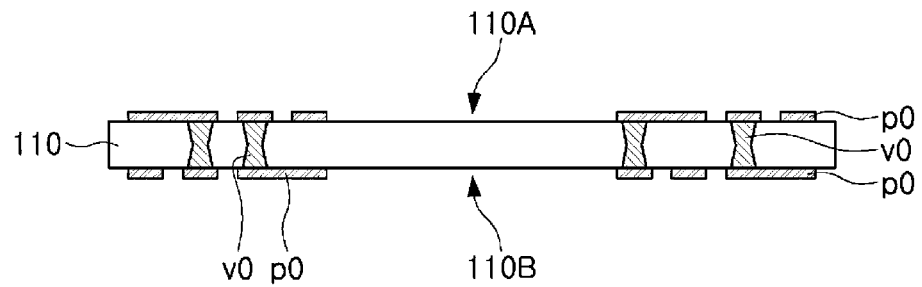
FIG. 3A to FIG. 3G are diagrams illustrating an example of manufacturing the circuit board of FIG. 2A.
Figure 3B:
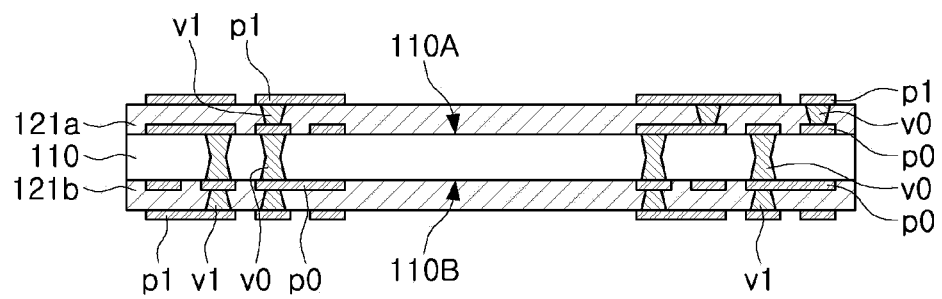

Referring to FIG. 3B, the first build-up layer and the second build-up layer 121a and 121b may be formed on the first surface and the second surface of the core layer 110A and 110B, respectively.

The first build-up layer and the second build-up layer 121a and 121b may be formed by various processes. For example, the first build-up layer and the second build-up layer 121a and 121b may be formed by compressing an insulating resin using a laminator in an unhardened (or semi-hardened) film and then hardening the result. In another example, the first build-up layer and the second build-up layer 121a and 121b may be formed by coating the first surface and the second surface 110A and 110B with a liquid insulating material for build-up layers and then hardening the result.

A conductive via v1 may be formed by drilling the first build-up layer and the second build-up layer 121a, 121b using a mechanical drill and/or a laser drill which is similar to the foregoing process. An insulating material of build-up may be a photosensitivity insulating resin. In this case, a hole for the conductive via v1 may be formed using the photolithography.

In an example, it is illustrated that one build-up layer 121a and 121b are formed on the first surface and the second surface 110A and 110B of the core layer 110, respectively. However, it is not limited thereto. For example, a plurality of build-up layers may be formed on each surface 110A and 110B of the core layer 110 (see FIG. 7 and FIG. 8).

Figure 3C:
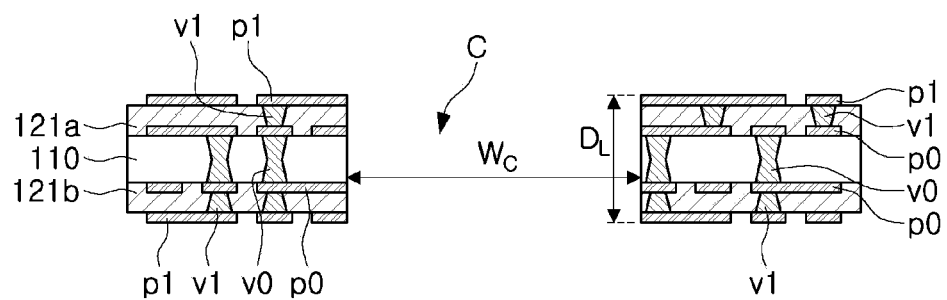

Referring to FIG. 3C, a cavity C may be formed to pass through the board laminate, which includes the core layer 110 and the first build-up layer and the second build-up layer 121a, 121b. This process may be performed through a mechanical process, such as, for example, using punching or blade to form the cavity C. The heat dissipation unit (130 in FIG. 3D) is to be inserted in the cavity C. Therefore, the cavity C may be also formed to correspond to the shape of the heat dissipation unit (130 in FIG. 3D). However, the process is not limited thereto.

A depth ($D_L$) of the cavity C may correspond to a thickness of the board laminate. A width Wc of the cavity C may be designed to let the heat dissipation unit, which is to be inserted to the cavity C, be spaced-apart from the inner wall of the cavity C.

Figure 3D:
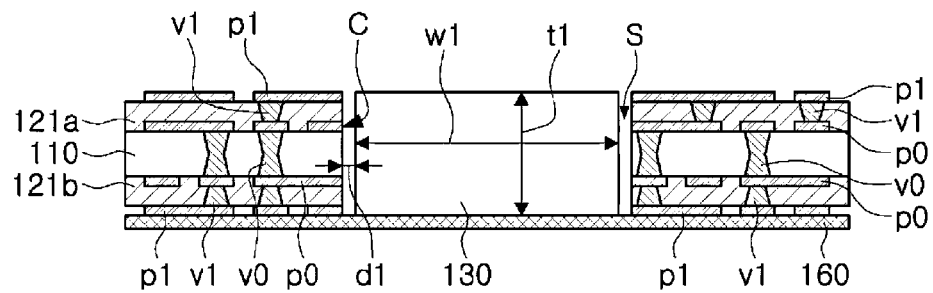

As shown in FIG. 3D, the board laminate, in which the cavity C is formed, may be arranged on a supporting film 160 and the heat dissipation unit 130 may be inserted inside the cavity C.

The board laminate may be arranged such that a surface of the second build-up layer 121b is in contact with the supporting film 1 In an example, supporting film 160 may be a tape having adhesion strength. The supporting film 160 may provide an area to arrange the heat dissipation unit 130 by temporally blocking one open surface of cavity C. The heat dissipation unit 130, which is inserted into the cavity C, may have a thickness t1 corresponding to the depth of the cavity C, which is the thickness of the board laminate. The width w1 of the heat dissipation unit 130 is less than the width Wc of the cavity C so that the heat dissipation unit 130 may be arranged to have a constant space S from the inner wall of the cavity C.

Figure 3E:
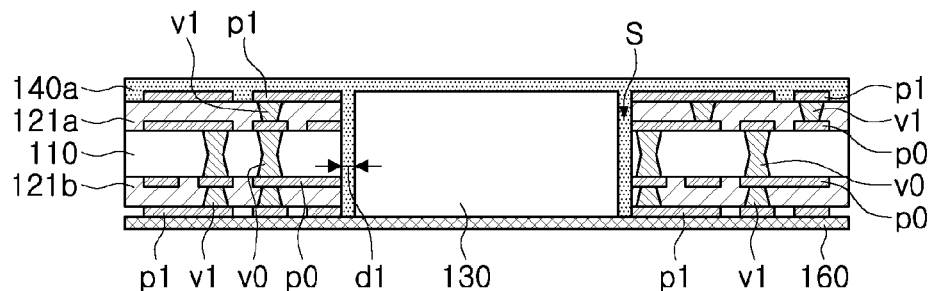
Figure 3F:
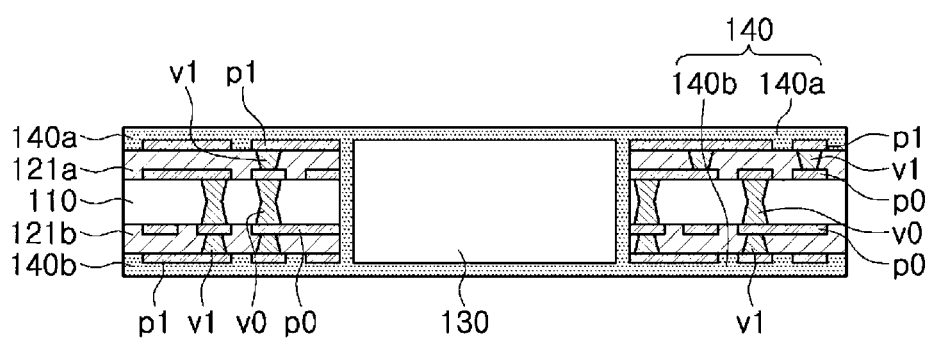

An outer layer may be formed on the surface of the first build-up layer and the second build-up layer 121a and 121b. As shown in FIG. 3E and FIG. 3F, forming an outer layer may include forming a first outer layer and a second outer layer 140a and 140b.

As shown in FIG. 3E, the first outer layer 140a may be formed on the surface of the first build-up layer 121a. The first outer layer 140a may be formed to cover the upper surface of the heat dissipation unit 130. The first outer layer 140a may be formed further to fill the space between the heat dissipation unit 130 and the inner wall of the cavity C. For example, the first outer layer 140a may be formed by coating the surface of the first build-up layer 121a and the upper surface of the heat dissipation unit 130 including the space between the heat dissipation unit 130 and the inner wall of the cavity C with an unhardened (e.g., liquid) insulating resin for the solder resist, and then hardening the result after planarizing. In an example, the insulating resin for the solder resist may be a photosensitivity insulating resin.

As shown in FIG. 3F, the supporting film 160 may be removed from the surface of the second build-up layer 121b and then second outer layer 140b may be formed on the surface of the second build-up layer 121b.

The second outer layer 140b may be made of the same solder resist material as used for the first outer layer 140a. The second outer layer 140b may be formed by coating with the unhardened insulating resin for the solder resist uniformly and hardening the result. In an example, the insulating resin for the solder resist may be a photosensitivity insulating resin. In addition, an opening part may be formed through exposure and developing processes, as explained with reference to FIG. 3G.

Figure 3G:
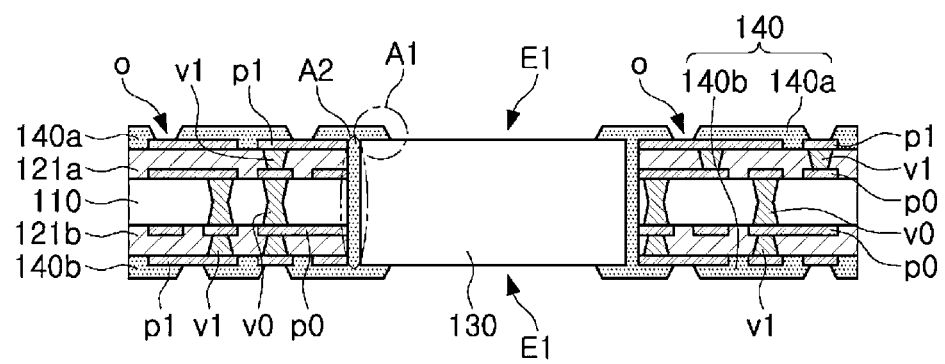

As shown in FIG. 3G, a plurality of opening parts o may be formed on the outer layer 140. The area where a solder bump is to be formed among the conductive patterns p1 may be opened by the opening part o. In this process, the area which covers the upper surface and the lower surface of the heat dissipation unit 130 from the first outer layer and second outer layer 140a, 140b may be eliminated. Thus, the main area E1 of the upper surface and the lower surface of the heat dissipation unit 130 may be exposed to the outside to improve the thermal dissipation. However, at least the area A1 of the outer layer which covers the edge of the upper surface and the lower surface of the heat dissipation unit 130 may be left in place. The area A1 and the area A2, which is placed in the space S of the side surface of the heat dissipation unit, may firmly support the heat dissipation unit 130 to remain inside the cavity C.

In an example, this process may be performed by selectively eliminating the outer layer 140 using an etching resist pattern. When a photosensitivity insulating resin is used as the outer layer, an opening part may be formed through exposure and developing of the first outer layer 140a and the second outer layer 140b.

The circuit board according to an example may be formed in various examples. For example, an exposed area of the heat dissipation unit may be formed.

Figure 4:
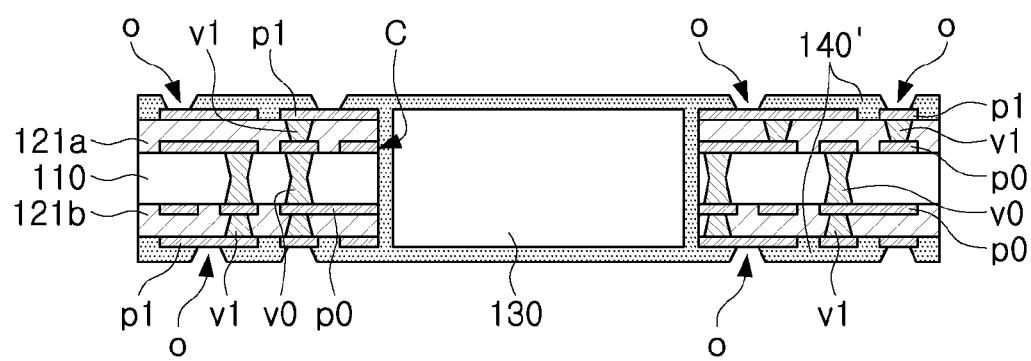
FIG. 4 is a diagram illustrating an example of a circuit board.

Referring to FIG. 4, a circuit board 100' according to an example is similar to the circuit board 100 illustrated in FIG. 2A but includes an outer layer 140' in which the area placed on the upper surface and the lower surface of the heat dissipation unit 130 is not opened.

In this example, even though the area placed on the upper surface and the lower surface of the heat dissipation unit 130 is not opened, it may not deteriorate the heat dissipation performance since it is only covered by the thin outer layer 140'. This may actually prevent undesired electrical connection between an electro component, which is to be installed, and the heat dissipation unit 130.

The circuit board 100' may be formed not to open the upper surface and the lower surface of the heat dissipation unit 130 during the process of forming the opening part o in FIG. 3G after similarly performing the processes of FIG. 3A to FIG. 3F.

Figure 5A:
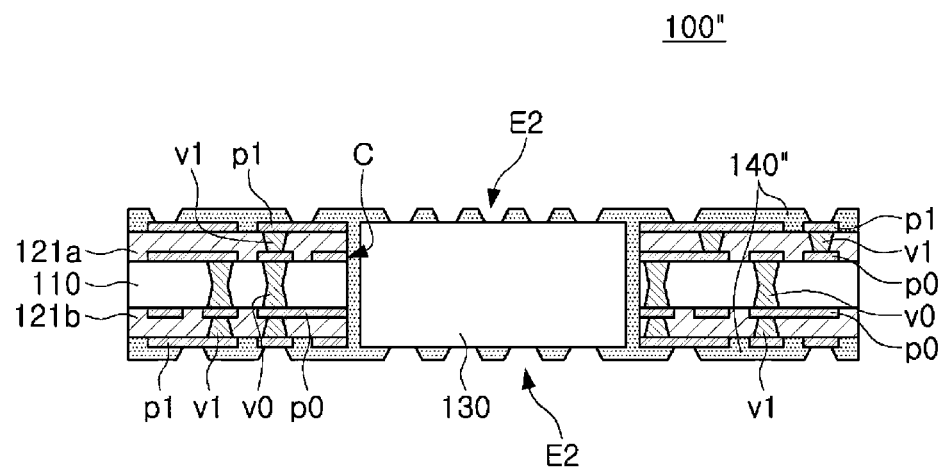
FIG. 5A and FIG. 5B are diagrams illustrating an example of a circuit board.
Figure 5B:
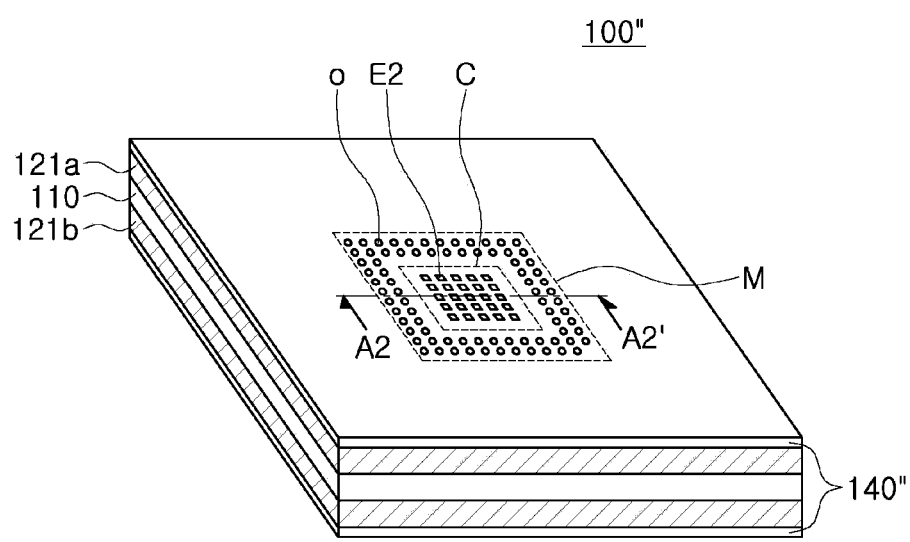

FIG. 5A and FIG. 5B are a diagrams illustrating examples of a circuit board (partially opened). FIG. 5A is an example of a sectional view of a part (A2-A2') of the circuit board illustrated in FIG. 5B.

Referring to FIG. 5A, a circuit board 100" according to an example is similar to the circuit board 100 illustrated in FIG. 2A but includes an outer layer 140" in which a plurality of heat dissipation opening parts E2 are formed. A part of the upper surface and the lower surface of heat dissipation unit 130 may be exposed to the outside through the heat dissipation opening parts E2. The heat dissipation opening parts E2 of the outer layer 140" may be formed in various shapes and in various arrangements. The heat dissipation opening parts E2 of the outer layer 140" may be formed to be similar to the opening part o to be connected with the solder bump.

As shown in FIG. 5B, the heat dissipation opening part E2, which is positioned at the area corresponding to the heat dissipation unit, and the opening parts o, through which the conductive pattern is to be exposed, may be arranged on an electronic component mounting area M from which heat is generated. The heat dissipation opening part E2 may be utilized for multiple purposes. For example, as shown in FIG. 6, the heat dissipation opening part E2 may be used as a contact path between an electro component 150 and the heat dissipation unit 130 by using an additional connecting means.

Figure 6:
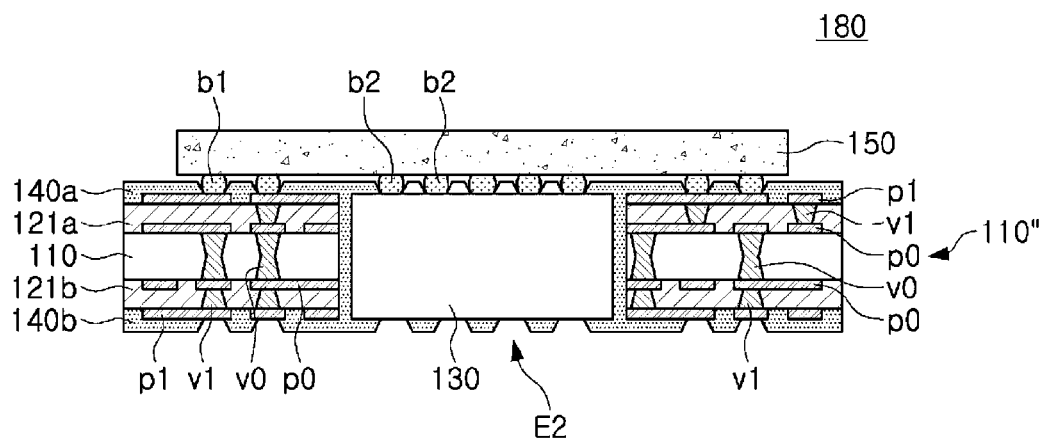
FIG. 6 is a diagram illustrating an example of a module in which the circuit board of FIG. 5A is applied.

A module 180 in FIG. 6 may include the circuit board 100" and the electro component 150 such as, for example, an application processor chip which is mounted on the circuit board 100".

The electro component 150 may be connected with the conductive pattern p1 through a first solder bump b1 so that the electro component 150 is able to transmit electric signals with a circuit of the circuit board 100". Furthermore, the electro component 150 may be directly in contact with the heat dissipation unit 130 by forming a second solder bump b2 in the heat dissipation opening part E2. In an example, the second solder bump b2 may be the same material as the first solder bump b1 and be formed together when the first solder bump b1 is formed. The second solder bump b2 may be provided in the area where the circuit of the electro component 150 is not connected, and thus, the second solder bump b2 may be used as a heat releasing path, rather than being used as a circuit connection element such as the first solder bump b1.

As described above, the outer layer formed on the upper surface and the lower surface of the heat dissipation unit may be formed in various shapes. Examples show that the outer layer region formed on the upper surface and the lower surface of the heat dissipation unit has the same structure but may be formed in a different form if needed. For example, a part adjacent to the edge of the lower surface of the heat dissipation unit may be covered by the outer layer and the rest part may be exposed. In another example, the upper surface of the heat dissipation unit may be designed to be completely covered by the outer layer or to have a plurality of the heat dissipation opening parts.

In examples above, only one build-up layer is formed on each surface of the core layer. However, as shown in the examples of FIG. 7 and FIG. 8, a plurality of build-up layers may be formed and further the cavity may be formed in various structures.

Figure 7:
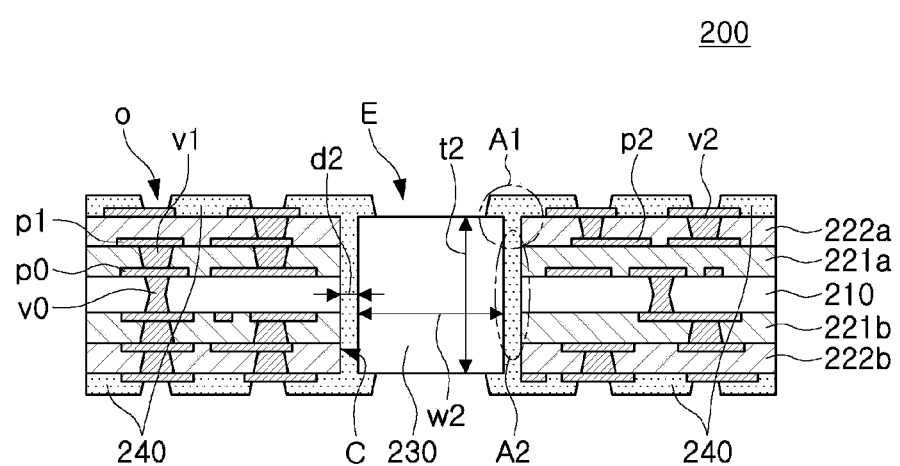
FIG. 7 is a diagram illustrating an example of a circuit board.
Figure 8:
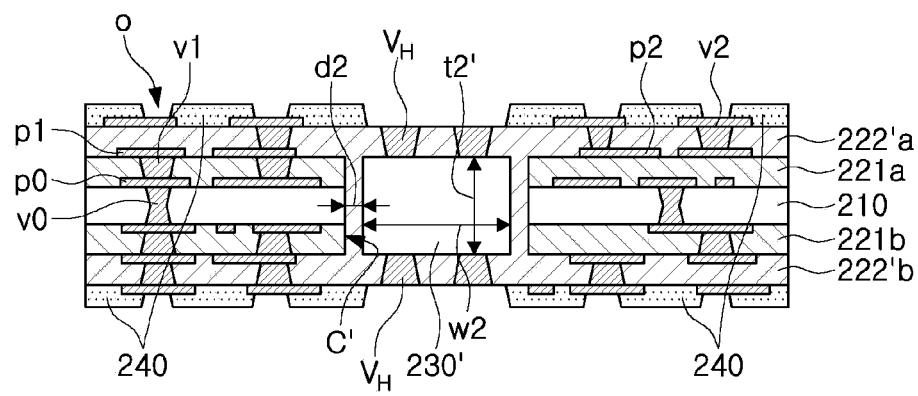
FIG. 8 is a diagram illustrating another example of a circuit board.

Referring to FIG. 7, a circuit board 200 according to an example includes a core layer 210, first build-up layers 221a and 222a and second build-up layers 221b and 222b formed on the upper surface and the lower surface of the core layer 210

The core layer 210 may include an inner layer circuit including a conductive pattern p0 formed on the upper surface and the lower surface of the core layer 210 and a conductive via v0 configured to pass through the core layer 210 and to connect the upper surface and the lower surface thereof. Each of the first build-up layer 221a and the second build-up layer 221b on the upper surface and the lower surface of the core layer 210 may include a first outer layer circuit including a conductive pattern p1 and a conductive via v1. Each of the first build-up layer 222a and the second build-up layer 222b formed as the second layer on the core layer 210 may include a second outer layer circuit including a conductive pattern p2 and a conductive via v2.

A cavity C according to an example may pass through the board laminate and a heat dissipation unit 230 may be arranged inside the cavity C. The board laminate may comprise the plurality of the first build-up layers and the second build-up layers 221a, 222a, 221b, 222b in addition to the core layer 210. Thus, a thickness t2 of the heat dissipation unit 230 may correspond to a thickness of the board laminate which is a depth of the cavity C. The heat dissipation unit 230 may be arranged to be close to the surface of the second build-up layers 222a and 222b, which are formed as the outmost layers to release heat effectively.

Similar to the example illustrated in FIG. 2A, an outer layer 240 may be formed to be connected to the heat dissipation unit 230. The heat dissipation unit 230 may be supported inside the cavity C by parts A1, A2 where the outer layer 240 and the heat dissipation unit 230 are connected. A width w2 of the heat dissipation unit 230 may be designed to be less than that of the cavity C so that the heat dissipation unit 230 may be arranged to have a constant distance d2 from the inner wall of the cavity C. Thus, the heat dissipation unit 230 may be firmly supported by the area A2 which is filled between the inner wall of the cavity C and the heat dissipation unit 230 among the outer layer 240. The heat dissipation unit 230 may be supported by the area A1 extended to a part of the edge of the upper surface and the lower surface of the heat dissipation unit 230 among the outer layer 240 but the rest of the area E of the upper surface and the lower surface of the heat dissipation unit 230 may be exposed.

Even though a heat releasing path becomes longer due to an increase of the number of the build-up layers, the thermal dissipation performance can be improved by forming the cavity C which passes through the board laminate and provides sufficient volume of the heat dissipation unit 230 by utilizing the space of the cavity C.

As shown in FIG. 8, if needed, a cavity C' may be formed only in the build-up layers 221a, 221b which are adjacent to the core layer 210.

Referring to FIG. 8, a circuit board 200' according to an example includes a core layer 210 and first build-up layers 221a, 222a' and second build-up layers 221b, 222b' formed on the upper surface and the lower surface of the core layer 210, respectively, which is similar to the example illustrated in FIG. 7. Unlike the example of FIG. 7, the cavity C' may be formed to pass only through the core layer 210 and the first build-up layer and the second build-up layer 221a, 221b which are adjacent to the core layer 210. The heat dissipation unit 230' may be supported in the cavity C' by a material of forming the first build-up layer and the second build-up layer 222a', 222b' formed as the outmost layers, instead of the outer layer 240. In this example, the build-up layer 222a', 222b' may be extended to fill the space between the inner wall of the cavity C' and the heat dissipation unit 230' to firmly fix the heat dissipation unit 230' inside the cavity C'.

The first build-up layer and the second build-up layer 222a', 222b' which are formed on the outmost may include a heat dissipation via $V_H$. The heat dissipation via $V_H$ may be directly connected with the heat dissipation unit 230' and be exposed to the surface of the circuit board 200'. Since the heat dissipation unit 230' having enough volume, which passes through the core layer 210 and the build-up layer 221a, 221b which are adjacent to the core layer 210, is inserted into the cavity C', the heat dissipation via $V_H$ formed only on the build-up layers 222a', 222b' may allow to be directly connected with the heat dissipation unit 230'.

Figure 9:
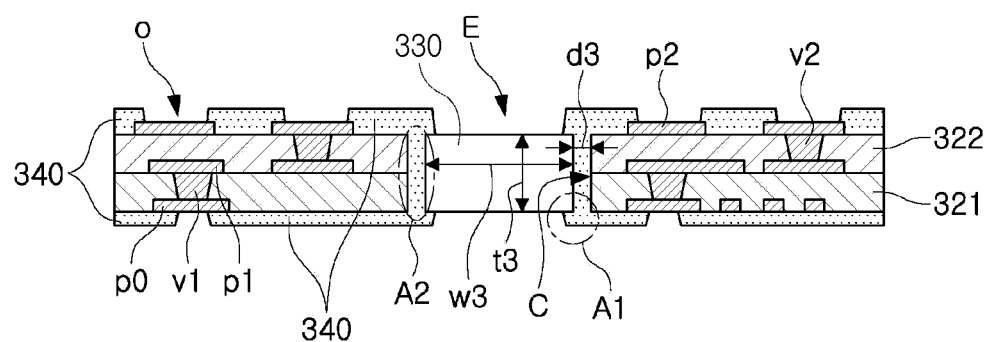
FIG. 9 is a diagram illustrating another example of a circuit board.

FIG. 9 is a diagram illustrating another example of a coreless circuit board.

Referring to FIG. 9, a circuit board 300 according to an example includes a first build-up layer 321 and a second build-up layer 322, which are laminated in order. Such a laminate of the build-up layer without a core layer may be called as a "build-up laminate."

The first build-up layer 321 may include conductive patterns p0, p1 formed on the upper surface and the lower surface of the first build-up layer 321. A conductive via v1 passing through the first build-up layer 321, connects the upper surface and the lower surface thereof. The second build-up layer 322 may be formed on the first build-up layer 321 and include a conductive pattern p2 and a conductive via v2.

A cavity C according to an example may pass through the build-up laminate and a heat dissipation unit 330 may be arranged therein. The cavity C may be formed to pass through both the first build-up layer 321 and the second build-up layer 322. A thickness t3 of the heat dissipation unit 330 may correspond to a thickness of the build-up laminate which is a depth of the cavity C. The heat dissipation unit 330 may be also arranged to be adjacent to the surface of the circuit board 300 to effectively release heat.

In this example, the circuit board 300 may include an outer layer 340. The outer layer 340 may be formed on the surface of the first build-up layer and the second build-up layer 321, 322 to be connected to the heat dissipation unit 330 of which structure is similar to the previous example. The heat dissipation unit 330 may be supported inside the cavity C by parts A1, A2 which are connected to the outer layer 340. The heat dissipation unit 330 may be designed to have a width w2 less than that of the cavity C so that it may be arranged to have a constant distance d3 from the inner wall of the cavity C. Thus, the heat dissipation unit 330 may be firmly supported by the area A2 which is filled between the inner wall of the cavity C and the heat dissipation unit 330 among the outer layer 340. The heat dissipation unit 330 may be supported by the area A1 extended to a part of the edge of the upper surface and the lower surface of the heat dissipation unit 330 among the outer layer 340. The rest area E of the upper surface and the lower surface of the heat dissipation unit 330 may be exposed.

The thermal dissipation performance can be improved by forming the cavity C which passes through the board laminate even in the coreless circuit board and providing sufficient volume of the heat dissipation unit 330 by utilizing the space of the cavity C.

Figure 10A:
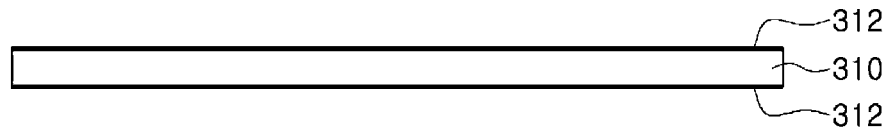
FIG. 10A to FIG. 10G are diagrams illustrating an example of manufacturing the circuit board of FIG. 9.

FIG. 10A to FIG. 10G are diagrams illustrating examples of a method for manufacturing the circuit board of FIG. 9. FIG. 10A shows a carrier board 310 having a releasing layer 312 on both the surface.

The releasing layer 312 may facilitate separation of a coreless board, which is to be formed on carrier board 310. The carrier board 310 may include an insulating plate and at least one metal foil formed on one surface of the insulating plate. In an example, the metal foil may include an inner layer metal foil and an outer layer metal foil. In an example, the releasing layer 312 may be arranged between the inner layer metal foil and the outer layer metal foil. The inner layer and the outer layer metal foil may be independently a copper foil. However, the inner layer and the outer layer metal foil may not be limited thereto.

Figure 10B:
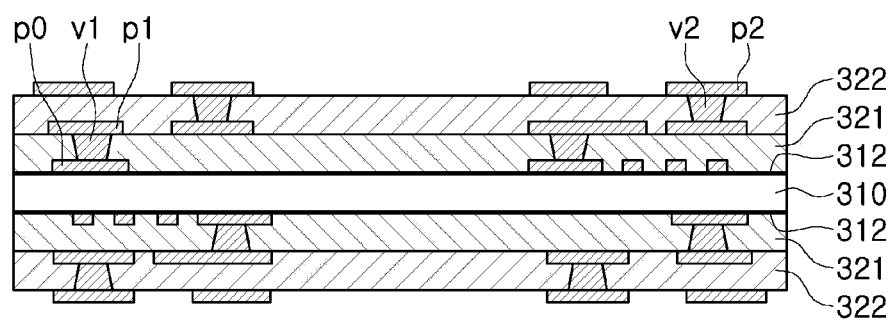
Figure 10C:
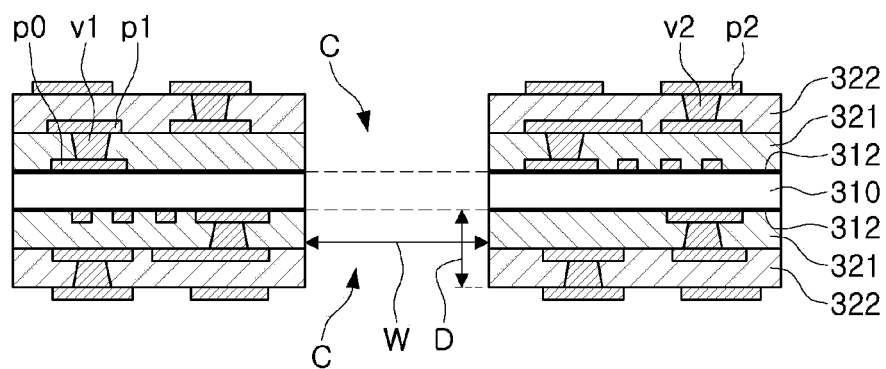

Referring to FIG. 10B, a first build-up layer 321 and a second build-up layer 322 may be formed in order on both surfaces of the carrier board 310.

A conductive pattern p0 may be formed on the surface of the carrier board 310 and conductive patterns p1, p2 and conductive vias v1, v2 may be formed on each surface of the first build-up layer 321 and the second build-up layer 322, respectively. As such, desired connecting circuits may be formed. Two build-up laminates in the coreless board may be formed on both surfaces of the carrier board 310 through this process.

The conductive patterns p0, p1, p2 may be formed through various processes. For example, the conductive patterns p0, p1, p2 may be formed using a deposition process such as, for example, CVD, PVD, or other selective plating processes. However, the process is not limited thereto. The first build-up layer and second build-up layer 321, 322 may be also formed in various methods. For example, the first build-up layer and second build-up layer 321, 322 may be formed by compressing an insulating resin in a unhardened (or semi-hardened) film and hardening the result or spin coating a liquid insulating resin and hardening the result.

The conductive via v1, v2 may be formed by forming a hole which passes through the first second build-up layer 321 or second build-up layer 322 and then plating the hole in various methods. The hole for the conductive via v1, v2 may be formed by using a mechanical drill and/or a laser drill. In another example, the hole may be also formed by forming the first build-up layer and second build-up layer 321, 322 using a photosensitivity insulating resin and then performing exposure and development process.

Referring to FIG. 100, a cavity C may be formed to pass through the first build-up layer and the second build-up layer 321, 322.

In this process, the cavity C may be formed to pass through the carrier board 310 and two build-up laminates formed on both surfaces of the carrier board 310. In an example, this process may be performed through a mechanical process using punching or blade. The cavity C may be also formed to correspond to the shape of the heat dissipation unit which is to be inserted into the cavity C. However, the process is not limited thereto.

A depth ($D_L$) of the cavity C may correspond to a thickness of the board laminate. A width Wc of the cavity C may be designed to allow the heat dissipation unit, which is to be inserted to the cavity C, to be spaced-apart from the inner wall of the cavity C.

Figure 10D:
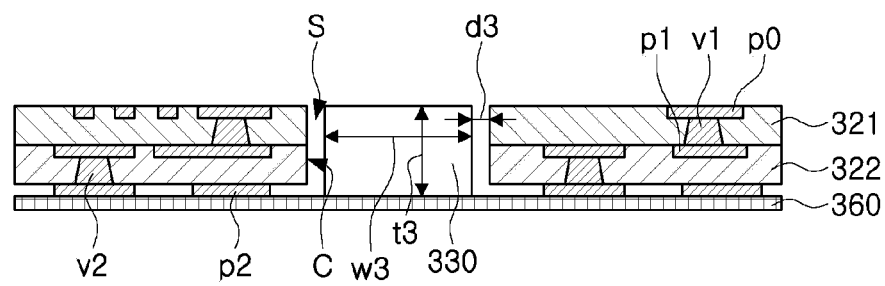

Referring to FIG. 10D, after the build-up laminate is adhered to a supporting film 360, the carrier board 310 is eliminated and the heat dissipation unit 330 is inserted to the cavity C.

The build-up laminate may be easily separated from the carrier board 310 by using the releasing layer 312 when the surface of the second build-up layer 322 of the build-up laminate is adhered to the supporting film 360. The supporting film 360 may be a tape having adhesion strength.

The heat dissipation unit 330, which is inserted into the cavity C, may have a thickness t3 corresponding to the depth of the cavity C, which is the thickness of the board laminate. The thickness of the build-up laminate may include the thickness of the conductive pattern p2 on the first build-up layer, the thickness of the first build-up layer 321 and the thickness of the second build-up layer 322. The width w3 of the heat dissipation unit 330 is less than the width W of the cavity C so that the heat dissipation unit 330 may be arranged to have a constant space S from the inner wall of the cavity C.

Figure 10E:
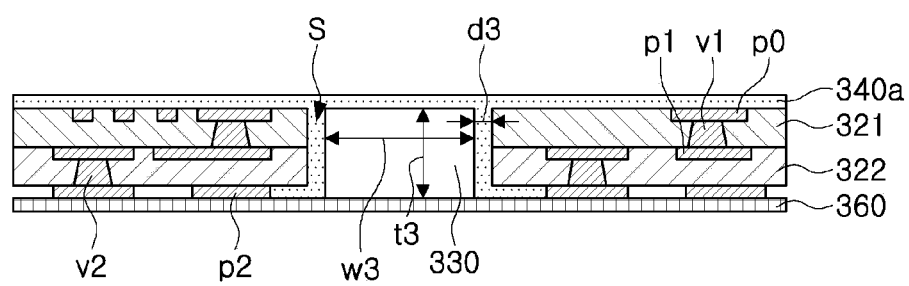

As shown in FIG. 10E, a first outer layer 340a may be formed on the surface of the first build-up layer 321. The first outer layer 340a may be formed to cover the upper surface of the heat dissipation unit 330. The first outer layer 340a may be formed further to fill the space between the heat dissipation unit 330 and the inner wall of the cavity C. For example, a first outer layer 340a may be formed by coating the surface of the first build-up layer 321 and the upper surface of the heat dissipation unit 330 including the space between the heat dissipation unit 330 and the inner wall of the cavity C with an unhardened (e.g., liquid) insulating resin for the solder resist, and then hardening the result after planarizing. The insulating resin for the solder resist may be a photosensitivity insulating resin.

Figure 10F:
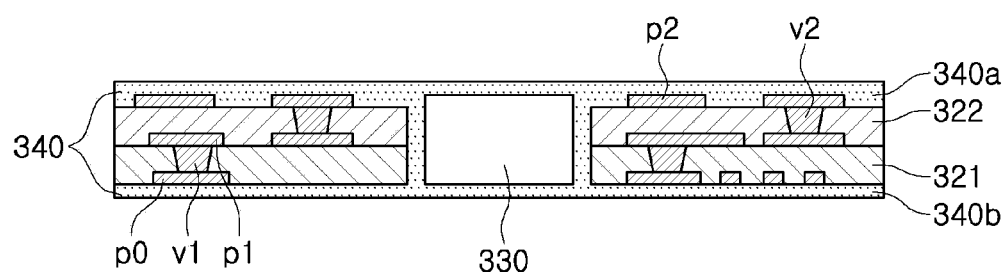

As shown in FIG. 10F, the supporting film 360 may be removed from the surface of the second build-up layer 322 and then second outer layer 340b may be formed on the surface of the second build-up layer 322.

The second outer layer 340b may be the same solder resist material as used for the first outer layer 340a. The second outer layer 340b may be formed by coating with the unhardened insulating resin for the solder resist uniformly and hardening the result. The insulating resin for the solder resist may be a photosensitivity insulating resin. In addition, an opening part may be formed through exposure and developing processes in the process described with reference to FIG. 10G.

Figure 10G:
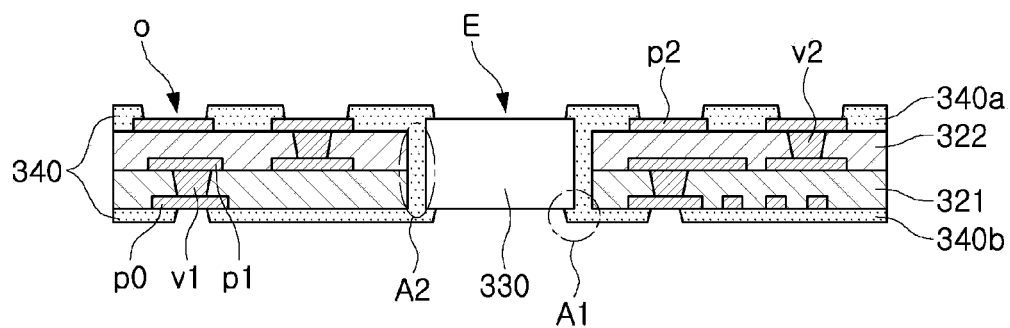

As shown in FIG. 10G, forming a plurality of opening parts o on the outer layer 340 may be performed.

The area where a solder bump is to be formed among the conductive patterns p1 may be opened by the opening part o. In this process, the area which covers the upper surface and the lower surface of the heat dissipation unit 330 from the first outer layer 340a and second outer layer 340b may be eliminated. Thus, the main area E of the upper surface and the lower surface of the heat dissipation unit 330 may be exposed to the outside to improve the thermal dissipation. However, at least the area A1 of the outer layer which covers the edge of the upper surface and the lower surface of the heat dissipation unit 330 may be left in place. The area A1 which is adjacent to the edge and the area A2, which is placed in the space S of the side surface of the heat dissipation unit, may firmly support the heat dissipation unit 330 inside the cavity C.

This process may be performed by selectively eliminating the outer layer 340 using an etching resist pattern. When a photosensitivity insulating resin is used as the outer layer, an opening part o may be formed through exposure and developing of the first outer layer 340a and the second outer layer 340b.

Figure 11:
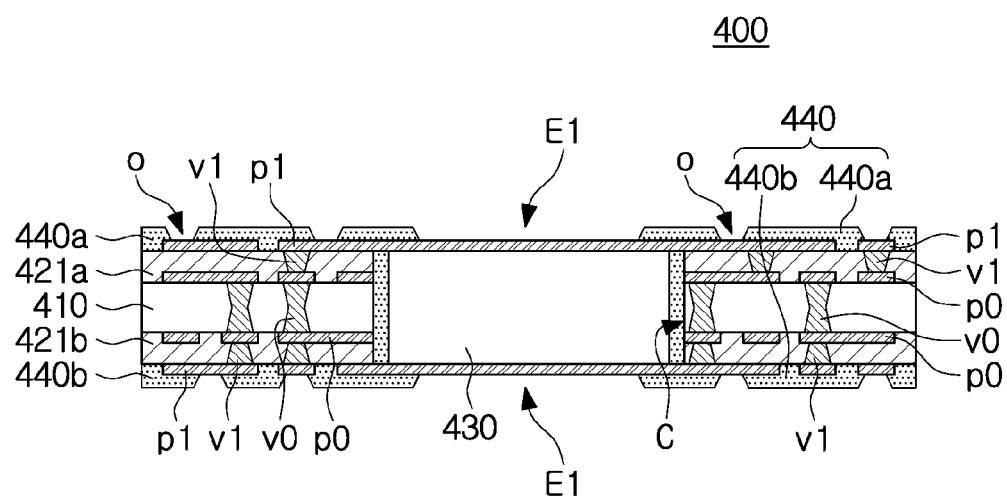
FIG. 11 is a diagram illustrating another example of a circuit board.
Figure 12:
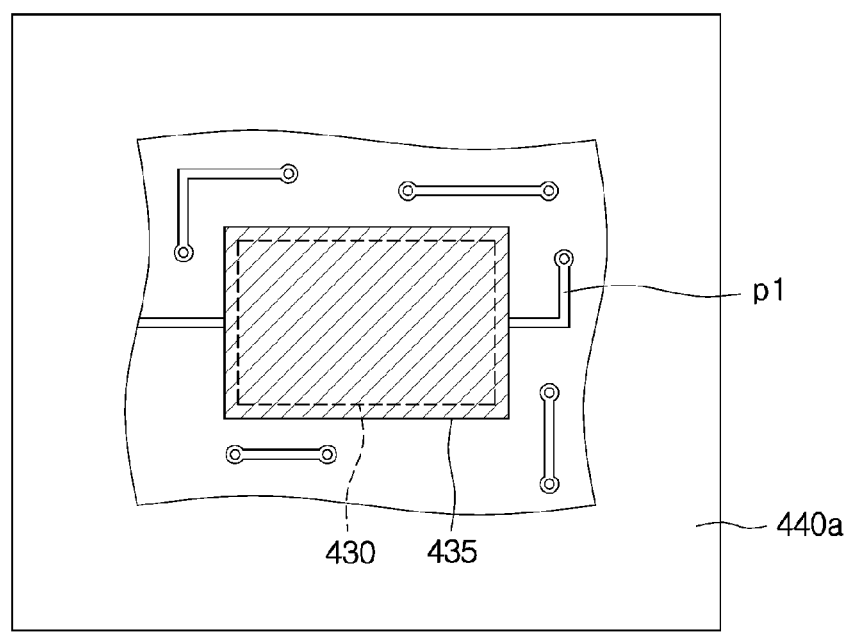
FIG. 12 is a diagram illustrating an example of inside of a circuit board.

FIG. 11 is a diagram illustrating another example of a circuit board and FIG. 12 is a diagram illustrating an example of the inside of a circuit board.

Referring to FIG. 11, a circuit board 400 according to an example may include a core layer 410, a first build-up layer 421a and a second build-up layer 421b formed on the upper surface and the lower surface of the core layer 410, respectively. The circuit board 400 may also include a heat dissipation unit 430, and a heat dissipation metal layer 435.

The heat dissipation metal layer 435 may be formed on at least one of the upper surface or the lower surface of the heat dissipation unit to optimize heat dissipation. A cross-sectional area of the heat dissipation metal layer 435 may be greater than that of the heat dissipation unit 430. The heat dissipation metal layer 435 may cover the upper surface and/or the lower surface of the heat dissipation unit 430.

A thickness of the heat dissipation unit 430 may be less than that of the board laminate. A thickness of the heat dissipation metal layer 435 may be equal to that of the conductive pattern formed on a surface of the first build-up layer 421a and that of the conductive pattern formed on a surface of the second build-up layer 421b.

A space may be formed between the heat dissipation unit 430 and the inner wall of the cavity C. The cross-sectional area of the heat dissipation unit 430 may be less than that of the cavity C. The space may be filled with an insulating resin. In an example, the insulating resin may be a prepreg or a photosensitivity insulating resin such as a PID (Photo Imagable Dielectric).

The heat dissipation metal layer 435 may be formed to cover the space between the heat dissipation unit 430 and the inner wall of the cavity C. The insulating resin filled into the space may be surrounded by the heat dissipation unit 430, the board laminate, and the heat dissipation metal layer 435.

An edge portion of the outermost surface of the heat dissipation metal layer 435 may be covered by the outer layers 440a and 440b. The rest of the outermost surface of the heat dissipation metal layer 435 may be exposed. The term 'outermost surface' means the surface, which is not in contact with the heat dissipation unit 430 and positioned at the outermost in the circuit board. The term 'edge portion' means a portion which is adjacent to the edge of the heat dissipation metal layer 435. For example, when the heat dissipation metal layer 435 is a square, the edge portion is a portion from four corners of the heat dissipation metal layer 435 to a point spaced-apart by a predetermined distance inwardly from four corners of the heat dissipation metal layer 435.

The dissipation metal layer 435 and the heat dissipation unit 430 may be held in place stably by the outer layers 440a and 440b.

The heat dissipation metal layer 435 may be formed of the same metal used for the heat dissipation unit 430. For example, the heat dissipation metal layer 435 may be formed of metal, such as, for example, Cu, Al, or Invar. However, the metal is not limited thereto, and other metals are considered to be well within the scope of the present disclosure.

Referring to FIG. 12, a side surface of the dissipation metal layer 435 may be formed to be connected with the conductive pattern. The side surface of the dissipation metal layer 435 may be particularly connected with the conductive pattern formed on the surface of the first build-up layer 421a and the conductive pattern formed on the surface of the second build-up layer 421b.

As such, when the surface of the dissipation metal layer 435 is connected with the conductive pattern, the conductive pattern may be formed in various designs.

Figure 13:
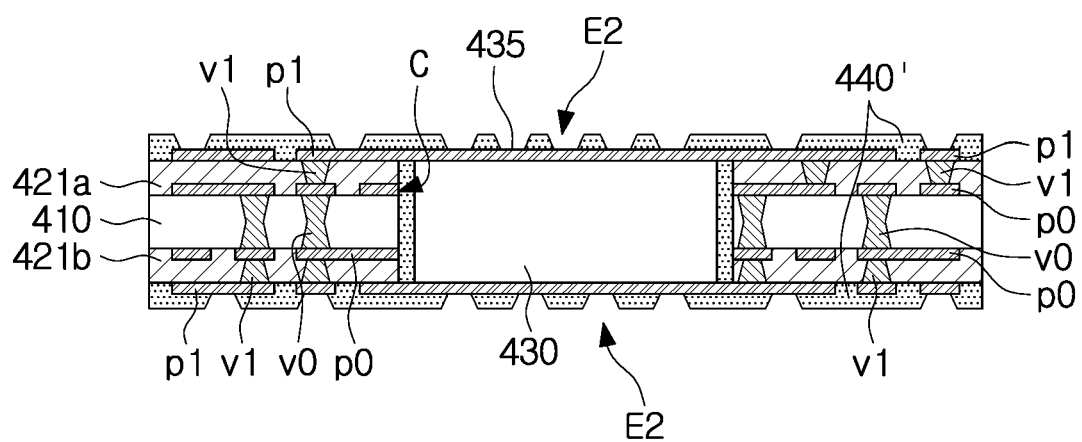
FIG. 13 is a diagram illustrating another example of a circuit board.

FIG. 13 is a diagram illustrating another example of a circuit board.

Referring to FIG. 13, a circuit board 400' according to an example is similar to the circuit board 400 illustrated in FIG. 11, except a plurality of openings E2 are formed on the outer layer 440'. A part of the upper surface and the lower surface of heat dissipation unit 430 may be exposed to the outside through the heat dissipation openings E2. The heat dissipation openings E2 of the outer layer 440' may be formed in various shapes and in various arrangements. The heat dissipation openings E2 of the outer layer 440' may be formed to be similar to the openings formed to be connected with the solder bump.

The heat dissipation openings E2 may be used in various ways. For example, the heat dissipation openings E2 may be used as a connection path between an electronic element and the heat dissipation unit 430 by using an additional connection means.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A circuit board comprising:
a core layer comprising a first surface and a second surface opposing the first surface;

at least one first build-up layer formed on the first surface, and comprising a first conductive pattern and a first conductive via;

at least one second build-up layer formed on the second surface, and comprising a second conductive pattern and a second conductive via;

a cavity formed to pass through the core layer, the first build-up layer and the second build-up layer;

a heat dissipation unit disposed inside the cavity so as to form a space between an inner wall of the cavity and the heat dissipation unit; and an outer layer formed on a surface of the first build-up layer and a surface of the second build-up layer and formed in the space, the outer layer being connected to the heat dissipation unit and comprising a solder resist.

2. The circuit board of claim 1, wherein the outer layer is formed integrally so as to be continually formed on the surface of the first build-up layer and the surface of the second build-up layer and in the space.

3. The circuit board of claim 1, wherein a thickness of the heat dissipation unit is greater than that of the core layer.

4. The circuit board of claim 3, wherein the thickness of the heat dissipation unit is at least 80% of a depth of the cavity.

5. The circuit board of claim 1, wherein a first portion of a surface of the heat dissipation unit near an edge of at least one of the upper surface or the lower surface is covered by the outer layer and a second portion of the surface of the heat dissipation unit is exposed.

6. The circuit board of claim 1, wherein at least one of the upper surface or the lower surface of the heat dissipation unit is covered by the outer layer.

7. The circuit board of claim 1, wherein at least one of the outer layer comprises opening parts to expose a portion of the upper surface or the lower surface of the heat dissipation unit.

8. The circuit board of claim 1, wherein at least one of the first build-up layer and the second build-up layer comprises a plurality of build-up layers, and the cavity passes through the plurality of build-up layers.

9. The circuit board of claim 1, wherein at least one of the first build-up layer and the second build-up layer comprises a plurality of build-up layers, and the cavity does not pass through an outermost build-up layers.

10. The circuit board of claim 1, wherein a heat dissipation via is formed in the outermost built-up layer, and the heat dissipation via is directly connected to the heat dissipation unit.

11. The circuit board of claim 1, wherein the circuit board comprises a chip mounting area, and the cavity has a smaller area than the surface area of chip mounting area, and the cavity is arranged inside the chip mounting area.

12. The circuit board of claim 1, further comprising:
a heat dissipation metal layer formed on at least one of an upper surface and a lower surface of the heat dissipation unit so as to be disposed between the heat dissipation unit and the outer layer and having a greater cross-sectional area of than the heat dissipation unit.

13. The circuit board of claim 12, wherein the heat dissipation unit is spaced apart from an inner wall of the cavity, and the heat dissipation metal layer covers the space formed between the inner wall of the cavity and the heat dissipation unit.

14. The circuit board of claim 12, wherein a side surface of the heat dissipation metal layer is connected with the conductive pattern.

15. The circuit board of claim 12, wherein the outer layer has opening parts to expose at least a portion of the outermost surface of the heat dissipation metal layer.

* * * * *